US006633167B2

(12) United States Patent
Morita

(10) Patent No.: US 6,633,167 B2
(45) Date of Patent: Oct. 14, 2003

(54) SIGNAL SUPPLY APPARATUS AND METHOD FOR EXAMINING THE SAME, AND SEMICONDUCTOR DEVICE, ELECTRO-OPTICAL APPARATUS AND ELECTRONIC APPARATUS USING THE SAME

(75) Inventor: Akira Morita, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/880,712

(22) Filed: Jun. 12, 2001

(65) Prior Publication Data

US 2002/0005722 A1 Jan. 17, 2002

(30) Foreign Application Priority Data

Jun. 14, 2000 (JP) ....................................... 2000-178217

(51) Int. Cl.[7] ........................... G01R 31/08; G01R 1/30
(52) U.S. Cl. .................... 324/523; 324/512; 324/123 C
(58) Field of Search ................................ 324/523, 512, 324/123 C; 341/161

(56) References Cited

U.S. PATENT DOCUMENTS 3,648,175 A * 3/1972 Barnard et al. ............. 324/115
4,373,394 A * 2/1983 Renzel et al. ................. 73/606
4,842,371 A * 6/1989 Yasuda et al. .............. 350/333
5,606,320 A * 2/1997 Kleks ......................... 341/161
6,166,453 A * 4/1999 Kon'i et al. ............... 307/10.1
5,945,972 A * 8/1999 Okumura et al. ............. 345/98
6,232,899 B1 * 5/2001 Craven ........................ 341/126
6,429,641 B1 * 8/2002 Montrose ..................... 324/161
2002/0030648 A * 4/1999 Yamamoto et al. ........... 345/87

* cited by examiner

*Primary Examiner*—Andrew H. Hirshfeld
*Assistant Examiner*—Wasseem H. Hamdan
(74) *Attorney, Agent, or Firm*—Hogan & Hartson, LLP

(57) ABSTRACT

In a signal supply apparatus such as might find use in an electro-optical device, signals that are supplied from multiple digital-to-analog converters are subject to impedance conversion by respective voltage followers, and provided as outputs to control the operation of the device. In the signal supply apparatus in a diagnostic examination mode, switching elements are operated so that output lines of the voltage followers are short-circuited by an output examination line. A current value measured as a result of the short circuit is compared with a specified current value to make a good-or-bad determination for the signal supply apparatus.

10 Claims, 9 Drawing Sheets

SIGNAL SUPPLY APPARATUS AND METHOD FOR EXAMINING THE SAME, AND SEMICONDUCTOR DEVICE, ELECTRO-OPTICAL APPARATUS AND ELECTRONIC APPARATUS USING THE SAME

BACKGROUND OF THE INVENTION

The present invention relates to signal supply apparatus, methods for examining signal supply apparatus, and semiconductor devices, electro-optical apparatus and other electronic apparatus using the same.

FIG. 9 depicts a conventional signal supply apparatus 100 tat includes a voltage follower group 102 that performs impedance conversion of multiple input voltages $V_{IN}$. The voltage follower group 102 includes N number of voltage followers 102-1~102-N. Outputs $O_1$~$O_N$ are provided an output lines of the N number of voltage followers 102-1~102-N, respectively.

In the conventional apparatus described above for performing impedance conversion of the input voltages $V_{IN}$ by the respective plurality of impedance conversion circuits, when the performance of the apparatus is examined, the outputs $O_1$~$O_N$ of the respective voltage followers 102-1~102-N are independently measured and examined. However, it takes a substantially long time to examine output characteristics of each of the respective voltage followers 102-1~102-N in succession.

SUMMARY OF THE PREFERRED EMBODIMENTS

Aspects of the present invention can provide a signal supply apparatus and a method for examining the signal supply apparatus in which good or bad performances of a plurality of impedance conversion circuits can be examined in one lot, and a semiconductor device, an electro-optical apparatus, and an electronic apparatus that use the improved signal supply apparatus. In accordance with one embodiment of the present invention, in a method for examining a signal supply apparatus in which signals having specified voltages supplied from a plurality of signal supply sources are subject to impedance conversion, respectively, by a plurality of impedance conversion devices, and supplied to a plurality of output lines, respectively, wherein each of the plurality of output lines is short-circuited upon examination, and a current value detected on the short-circuited tines is compared with a specified current value to thereby determine as to whether the signal supply apparatus is good or bad.

Also, a signal supply apparatus in accordance with aspects of the present invention comprises a plurality of switching elements provided for the corresponding respective plurality of output lines, a rest terminal for inputting a test signal that controls open and close of each of the plurality of switching elements, and a detection terminal that is connected to the short-circuited lines.

In this manner, the respective impedance conversion devices cause deviations in their performances due to offset voltages. Therefore, when input signals are subject to impedance conversion by the respective impedance conversion devices and outputted, deviations are generated in the output signals. In the present invention, deviations are not independently measured based on the output signals of the respective impedance conversion devices. Instead, a composite current value obtained by short-circuiting output lines of the respective impedance conversion devices is measured. Then the measured composite current value is compared with a specified current value to thereby determine whether the apparatus itself is good or bad. As a result, the time for examining the performance of the signal supply apparatus can be shortened.

Also, in accordance with another embodiment of the present invention, in a method for examining a signal supply apparatus in which signals are subject to impedance conversion by a plurality of impedance conversion devices, respectively, and supplied to a plurality of output lines, the method is characterized in that each of the plurality of output lines is short-circuited upon examination, and a composite current consumption value of the plurality of impedance conversion devices is compared with a specified current value to thereby determine as to whether the signal supply apparatus is good or bad.

Also, a signal supply apparatus in accordance with aspects of the present invention comprises a plurality of switching elements provided for the corresponding respective plurality of output lines, a test terminal for inputting a test signal that controls open and close of each of the plurality of switching elements, a short-circuit line that short-circuits the plurality of output lines when the plurality of switching elements are operated, and a detection terminal for detecting the composite current consumption value.

Respective impedance conversion devices cause deviations in their voltages of input signals due to offset voltages. Therefore, the respective impedance conversion devices themselves consume power supply current. According to aspects of the present invention, the current consumption of each of the impedance conversion devices is compared with a specified current consumption value to thereby determine whether the apparatus itself is good or bad. As a result, the time for examining the performance of the signal supply apparatus can be shortened.

In addition, the signal supply apparatus can be used as a driver device to drive each of the plurality of data lines in a display section using electro-optical elements. As a result a determination can be made as to whether the data line driver IC itself is good or bad.

Also, the data line driver IC can be characterized in that, after a voltage is supplied to the test terminal and each of the plurality of switching elements is operated, a voltage with a voltage width range corresponding to ±(LSB)/2 with respect to the signal having the specified voltage to be supplied to the electro-optical element is supplied trough the detection terminal to the short-circuit line, a minimum value among the current values detected at the detection terminal in response thereto is compared with a specified current value to make a good-or-bad determination.

In this manner, a voltage V with a voltage width range corresponding to ±(LSB)/2 with respect to the specified voltage is supplied to each of the short-circuited line of the output line of the data line driver IC of the electro-optical apparatus.

In the relation between the voltage V and the composite current value I, a current value Imin that minimizes the composite current value I is compared with a predetermined current value, such that whether the apparatus is good or bad can be determined.

Also, in the data line driver IC, the specified voltage is characterized in that the specified voltage is set as a voltage that is supplied to the electro-optical element when the display section displays an intermediate gradation.

A curve representing light transmissivity of a display section of an electro-optical apparatus with respect to input voltages is not generally composed of linear lines, and relatively speaking, an input voltage with a higher accuracy needs to be applied for intermediate gradations.

Also, the data line driver IC can be applied to an electro-optical apparatus, and the electro-optical apparatus can be applied to an electronic apparatus.

DETAILED DESCRIPTION OF THE PREFERRED EMBODIMENTS

Embodiments of the present invention are described in connection with the accompanying drawings. As used herein, the acronym "DA" stands for "Digital-to-Analog", the acronym "LSB" stands for "Least-Significant-Bit", the acronym "TFT" stands for "Thin-Film Transistor", and the acronym "RGB" stands far "Red Green Blue".

Figure 1:
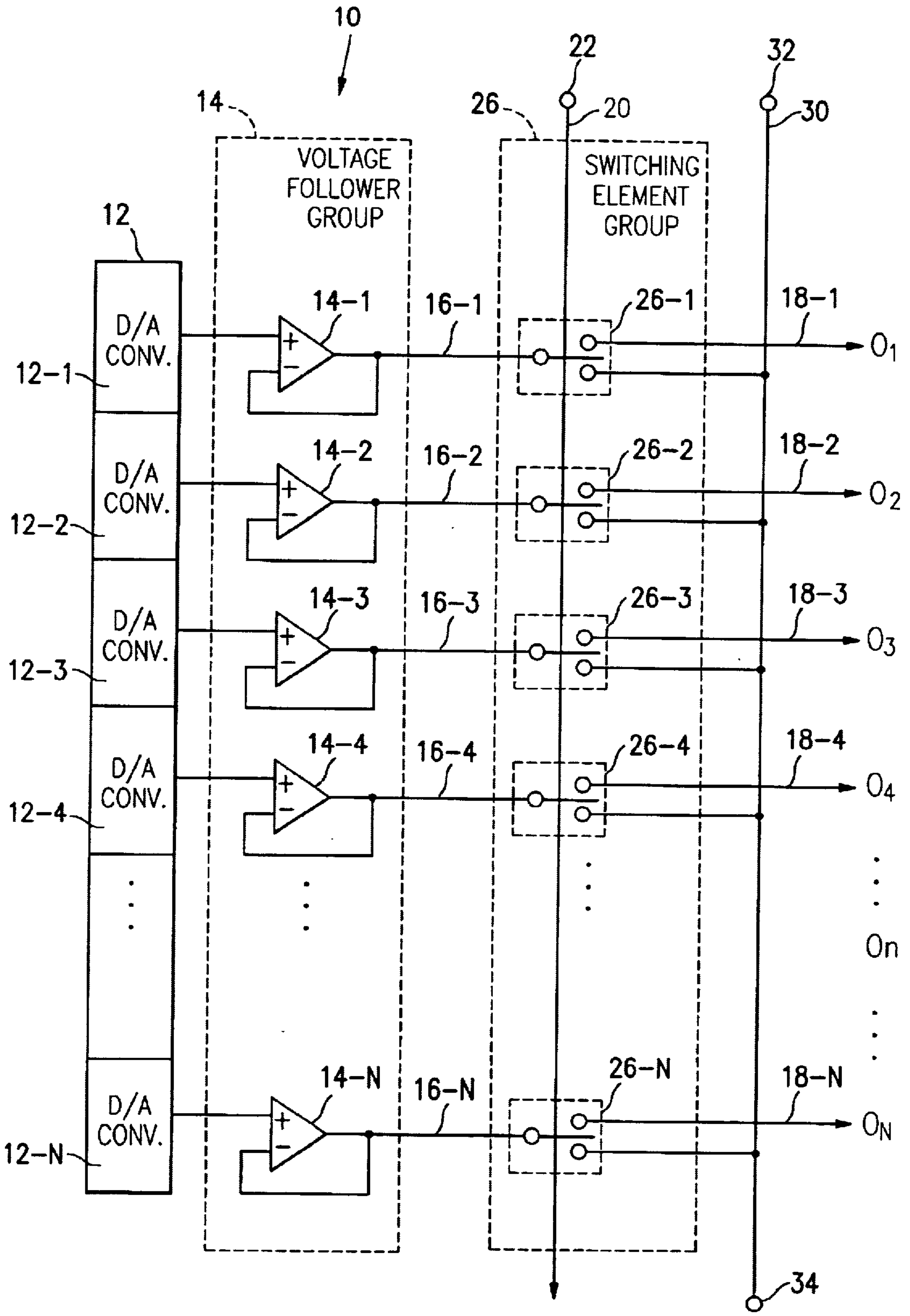
FIG. 1 shows a signal supply apparatus in accordance with a first embodiment of the invention.

FIG. 1 shows a signal supply apparatus in accordance with a first embodiment of the present invention.

The signal supply apparatus 10 includes a DA converter group 12, a voltage follower group 14, a switching element control line 20, a switching element group 26, and an output examination line 30. For example, the DA converter group 12 is composed of N number of DA converters, each of them being provided with a suffix 1 through N, such that they are presented in FIG. 1 as DA converters 12-1 through 12-N. In a similar manner, suffixes 1 through N are applied to components in the follower group 14, the switching element group 26 and output line groups 16 and 18, such that they are presented as voltage followers 14-1 through 14-N, switching elements 26-1 through 26-N, and the like, respectively.

Signal voltages output from the respective DA converters in the DA converter group 12 (operating as a signal supply source) are input to the corresponding voltage followers in the voltage follower group 14. The signal voltages that are subject to impedance conversion by the respective voltage followers in the voltage follower group 14 are supplied to the output line 16 as outputs $O_1$ through $O_N$, respectively. When the signal supply apparatus is in normal operation, the output lines 16 and the output lines 18 are connected by the switching elements in the switching element group 26. Each of the switching elements 26-1 through 26-N in the switching element group 26 includes, for example, an inverter circuit formed from N-channel type MOS transistors and P-channel type MOS transistors and a transmission circuit. On the other hand, in an examination mode in accordance with the present invention, a constant voltage is supplied through switching element control terminal 22 to the switching element control line 20. Consequently, each of the switching elements in the group 26 is switched so that the output lines 16 are all connected across an output examination line 30. As a result, in the examination mode, measured values such as a composite current value and the like are detected in a closed circuit including the output examination line 30 connected through the output examination terminals 32 and 34. A method in accordance with the present embodiment is described below for determining, based on these measured values, whether the apparatus is good or bad.

Figure 2:
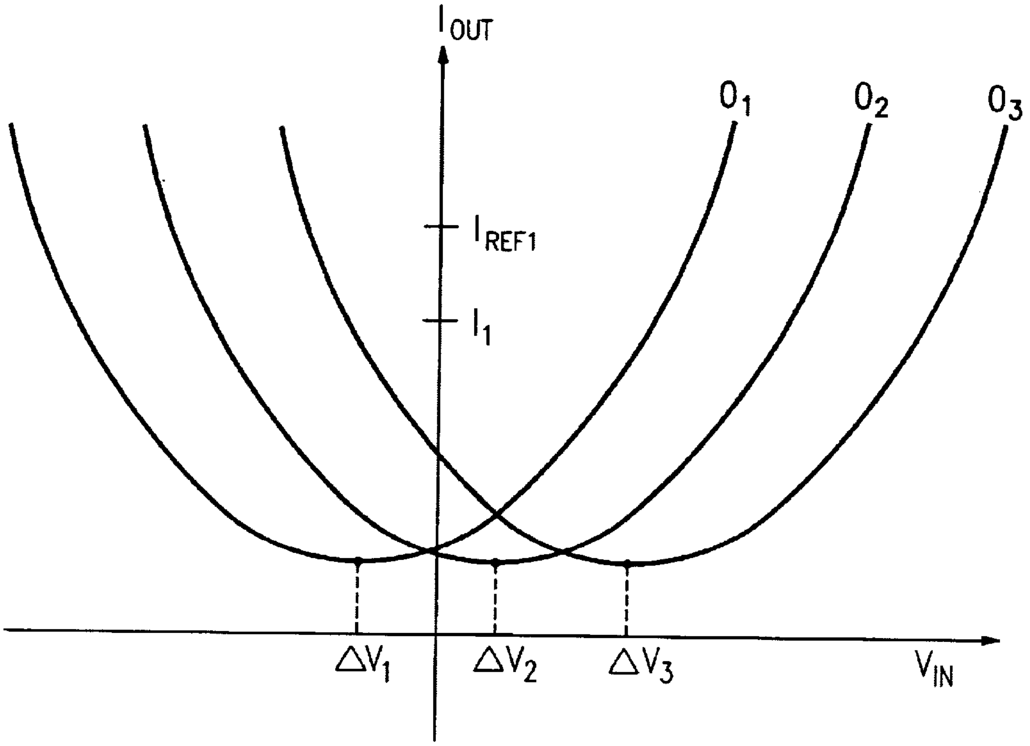
FIG. 2 illustrates the operation of the signal supply apparatus shown in FIG. 1.

FIG. 2 shows one example of output curves $O_1$ through $O_3$ representing relations between input voltages $V_{IN}$ that are supplied from the DA converters 12-1 through 12-3 and output currents $I_{OUT}$ that are output from the voltage followers 14-1 through 14-3 in response to the input voltages. In FIG. 2, input voltages $V_{IN}$ are defined along a transverse axis and output currents $I_{OUT}$ are defined along a vertical axis. In the output curves $O_1$ through $O_3$ shown in FIG. 2, for example, an offset voltage $\Delta V_1$ appears on the output curve $O_1$, an offset voltage $\Delta V_2$ appears on the output curve $O_2$, and an offset voltage $\Delta V_3$ appears on the output curve $O_3$. Due to the offset voltages, the output characteristics of the output curves $O_1$ through $O_3$ deviate from one another, even when the same input voltage $V_{IN}$ is input to each of the voltage followers 14-1 through 14-3 shown in FIG. 1.

In an examination mode in accordance with the present embodiment, the output lines 16-1 through 16-3 of the respective three voltage followers 14-1 through 14-3 are short-circuited. Then, a current value of the closed circuit thus short-circuited is measured through the output examination terminals 32 and 34. For example, the current value is measured as $I_1$. In this instance, when the measured composite current value $I_1$ is less than a reference current value $I_{ref1}$, the apparatus is determined to be a good product. Conversely, when the composite current value $I_1$ exceeds the reference current value $I_{ref1}$, the apparatus is determined to be a bad product.

It should be noted that the output lines 16-1 through 16-N are normally connected to the output lines 18-1 through 18-N, with the output lines 16-1 through 16-N short-circuited to the output examination line 30 only at the time of examination.

The voltage followers 14-1 through 14-N cause performance variations due to offset voltages. If each of them were measured individually to determine whether the apparatus were good or bad, it would take a longer time as the number N becomes greater. According to the present invention, a good-or-bad determination for the apparatus is not made based on deviations in the individual output signals of the respective voltage followers 14-1 through 14-N. Instead, a current value obtained by short-circuiting outputs from the respective voltage followers is measured to make a good-or-bad determination of the apparatus. As a result, the time for examining the performance of the signal supply apparatus can be shortened accordingly.

Figure 3:
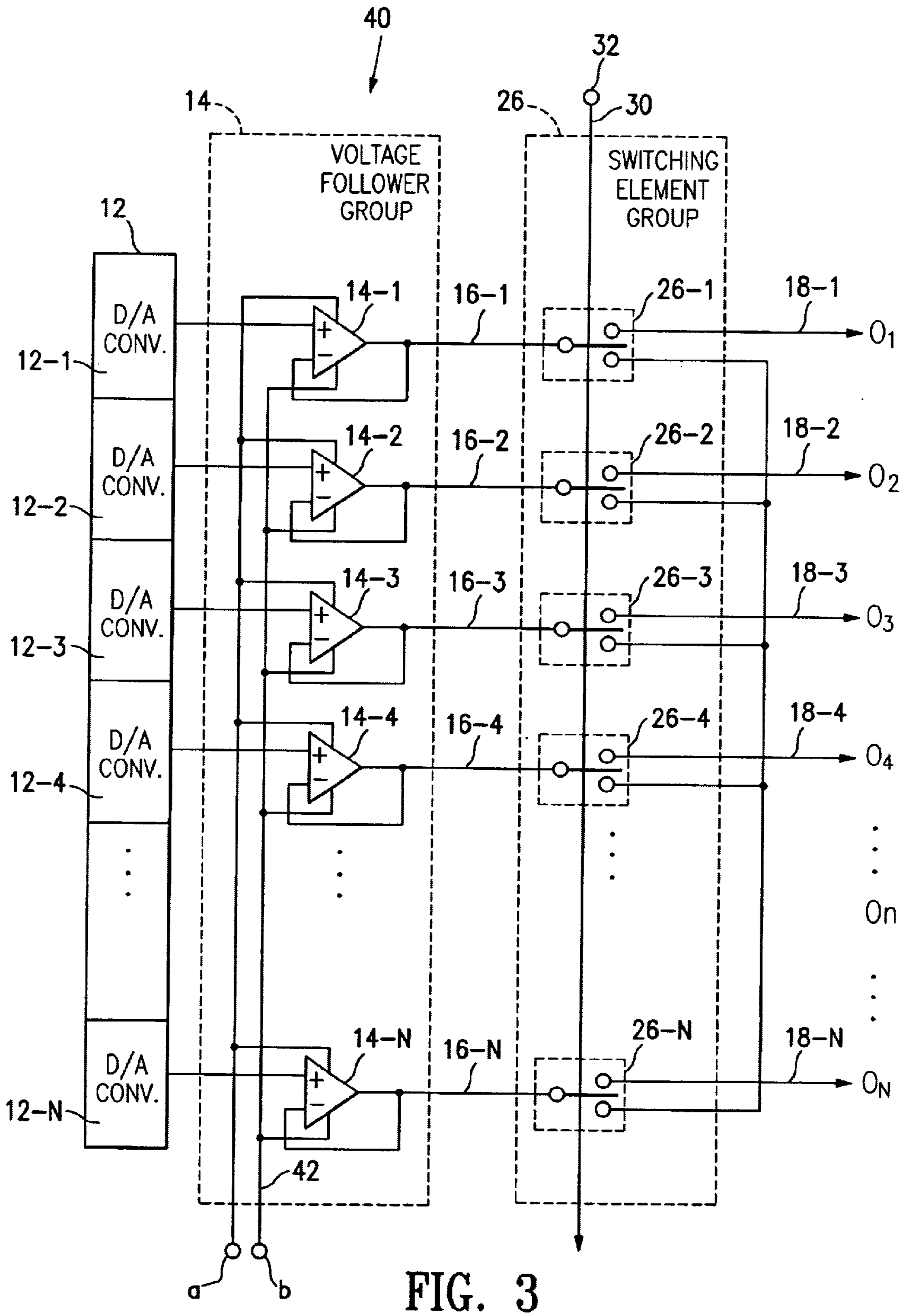
FIG. 3 shows a signal supply apparatus in accordance with a second embodiment of the invention.

FIG. 3 shows a signal supply apparatus in accordance with a second embodiment of the present invention.

In the signal supply apparatus 40 according to the second embodiment of the invention, in an examination mode, the switching elements in the switching element group 26 are operated in the manner described above, so that the voltage followers 14-1 through 14-N are short-circuited through a short-circuit line 44. At the same time, a power supply current that is supplied through a line 42 between power supply terminals a and b of each of the voltage followers in the group 14 is measured. The power supply current to be measured is a consumed current that is generated when the power supply current is consumed in response to an electric charge that shifts in a manner to offset a potential difference that appears on the short-circuit line 44. When the measured power supply current is below a specified power supply current value, the apparatus is determined to be a good product. On the other hand, when the measured power supply current exceeds the specified power supply current value, the apparatus is determined to be a bad product.

In this manner, in the signal supply apparatus in accordance with the invention, when deviations caused by the offset voltages and appearing on the respective voltage followers are small, the apparatus is determined to be a good product. As a result, the time for examining the performance of the signal supply apparatus can be shortened.

Figure 4:
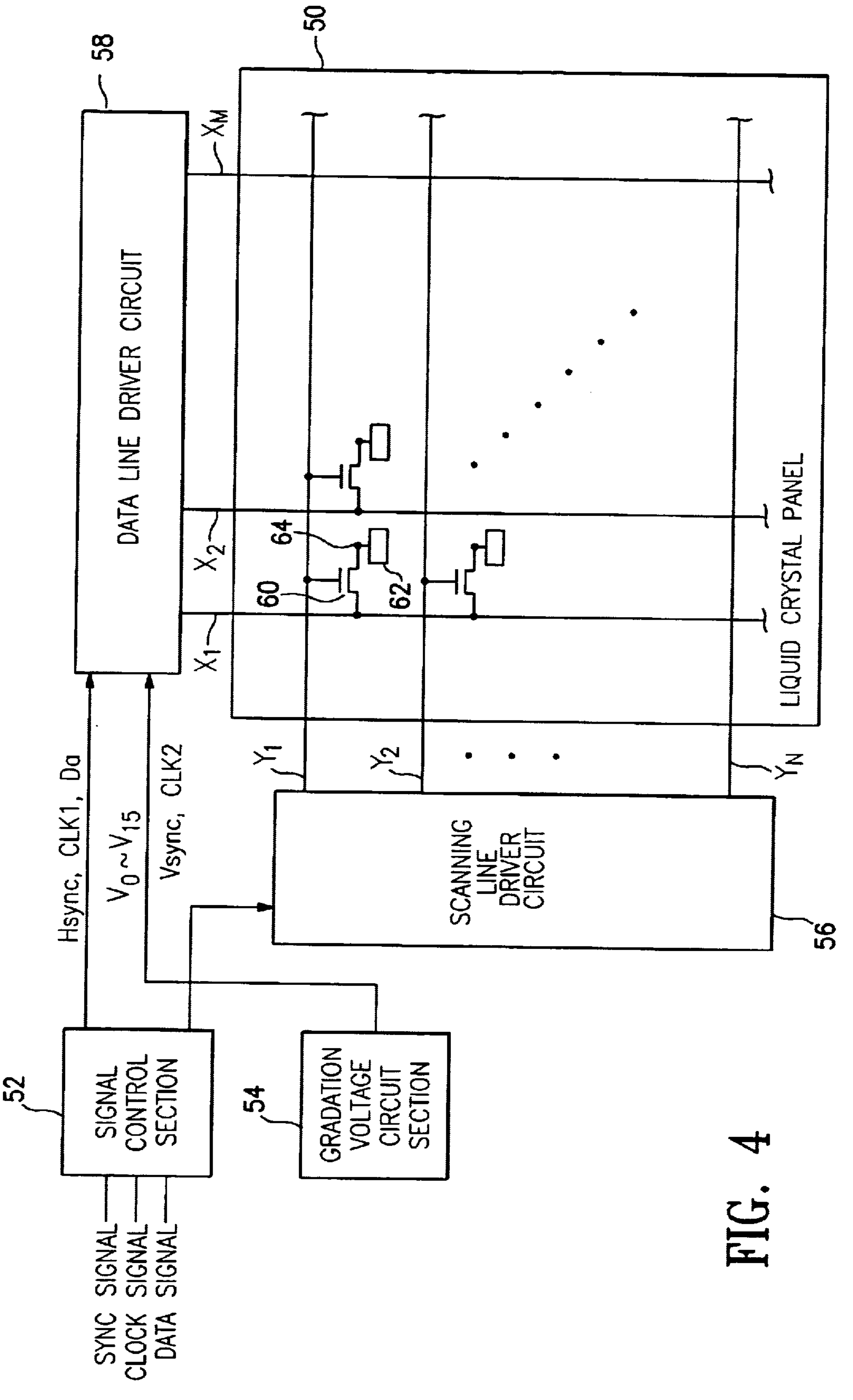
FIG. 4 shows a TFT-type liquid crystal apparatus according to a third embodiment of the invention.

FIG. 4 shows a TFT (Thin Film Transistor) type liquid crystal apparatus that uses the signal supply apparatus of the present invention shown in FIG. 1.

The liquid crystal apparatus includes a liquid crystal panel 50, a signal control circuit section 52, a gradation voltage circuit section 54, a scanning line driver circuit 56 and a data line driver circuit 58.

M number of scanning lines $Y_1$~$Y_m$~$Y_M$, and N number of data lines $X_1$~$X_n$~$X_N$ are disposed in the liquid crystal panel 50. N×M number of TFT elements 60, each having a switching function, are provided at pixels that are disposed corresponding to the intersections of the scanning lines $Y_1$~$Y_M$ and the data lines $X_1$~$X_N$. At the TFT element 60, the scanning line $Y_m$ is connected to its gate terminal and the data line $X_n$ is connected to its source terminal. A drain terminal of the TFT element 60 is connected to a capacitor 62 with a pixel electrode 64 at one end. The capacitor 62 is a simplified representation of a voltage applied to the liquid crystal layer and a retention capacitor retained in each of the pixels.

The signal control circuit section 52 supplies a horizontal synchronizing signal Hsync, a clock signal CLK1, and a data signal Da to the data line driver circuit 58. The horizontal synchronizing signal Hsync is input serially based on the clock signal CLK1, and is a signal that controls the timing to latch the stored data signal Da for one line.

In addition, the signal control circuit section 52 supplies a vertical synchronizing signal Vsync and a clock signal CLK2 to the scanning line driver circuit 56. Based on the clock signal CLK2, a signal supplied on the vertical synchronizing signal Vsync is successively shifted to a period head of the frame period.

The gradation voltage circuit section 54 supplies reference voltages, for example, voltages V0~V15, to the data line driver circuit 58 when data signal voltages to be supplied to the data lines $X_1$~$X_N$ are generated.

Figure 5:
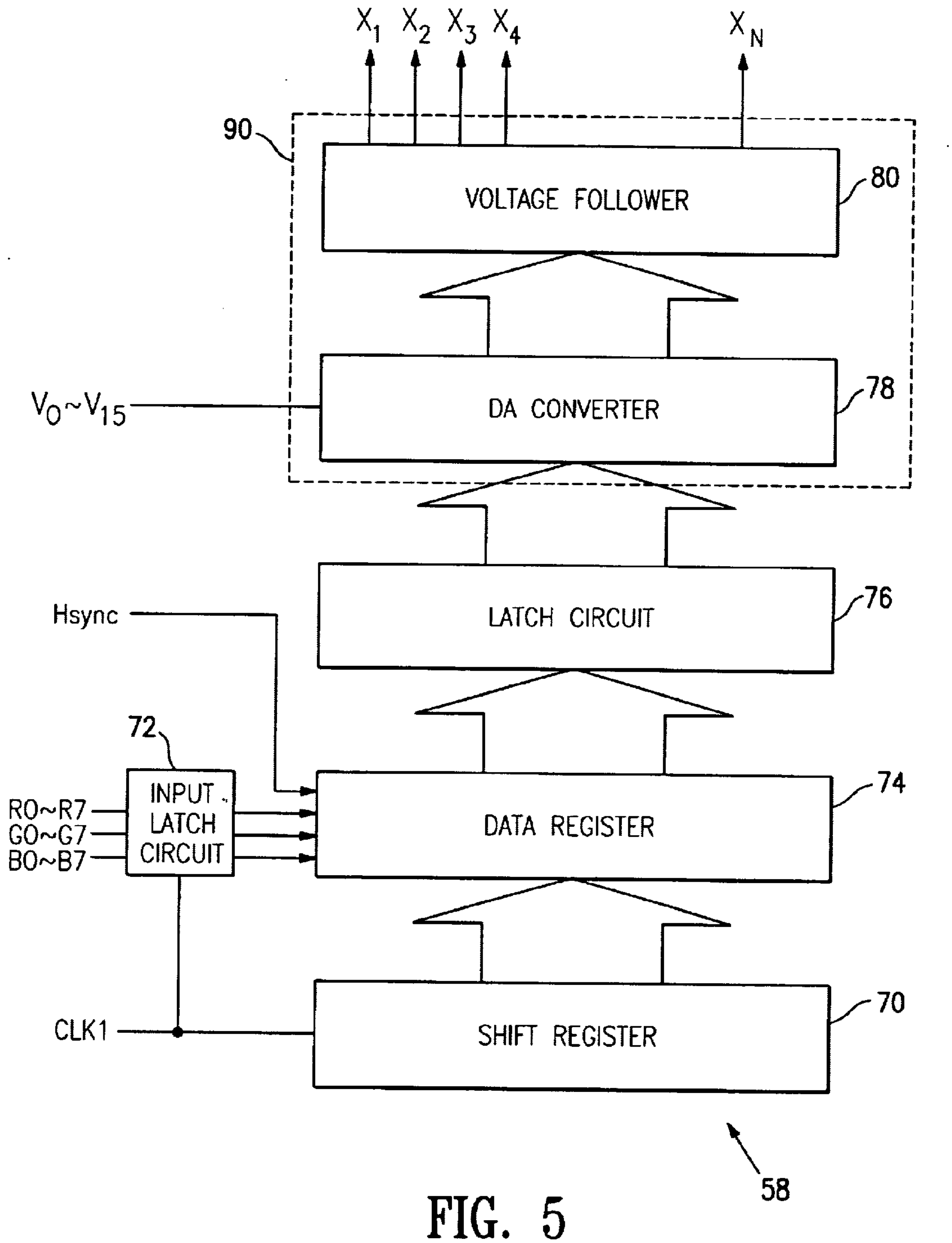
FIG. 5 illustrates an exemplary conventional data line driver circuit.

Here, FIG. 5 shows a composition of a conventional data line driver circuit.

In the data line driver circuit shown in FIG. 4, the signal control circuit section 52 supplies a clock signal CLK1, a horizontal synchronizing signal Hsync, and a data signal Da. As shown in FIG. 5, the data line driver circuit 58 includes a shift register 70, an input latch circuit 72, a data register 74, a latch circuit 76, a DA converter 78 and a voltage follower 80. The data signal Da supplied from the signal control circuit section 52 shown in FIG. 4 is, for example, RGB signals each composed of 8 bits (for displaying about 16.77 million colors). Each of the RGB signals (for example, R0~R7, G0~G7 and B0~B7 in the case of RGB signals each composed of 8 bits) is supplied in serial to the input latch circuit 72. Each of the serially input RGB signals is successively latched at the timing of the clock signal CLK1, and taken into the data register 74. Each of the RGB signals taken into the data register for one line is latched in the latch circuit 76 based on the horizontal synchronizing signal Hsync supplied from the signal control circuit section 52. Each of the RGB signals latched in the latch circuit 76 is supplied to the DA converter 78. Each of the RGB signals is subject to analog-conversion by the DA converter 78 based on reference voltages, for example, V0~V15 supplied from the gradation voltage circuit section 54. The analog-converted data signal voltages $V_{data}$ are subject to impedance conversion by the voltage follower 80, and then supplied to the data lines $X_1$~$X_N$ as data signal voltages $V_{data}$, respectively.

The data line signal supply apparatus 90 in the conventional data line driver circuit is replaced with the signal supply apparatus 10 shown in FIG. 1 to thereby form the data line driver circuit 58 shown in FIG. 4.

Examination is conducted in a manner described above in connection with the first embodiment for the data line driver circuit 58, such that a good-or-bad determination of the apparatus can likewise be made.

A method for determining whether the apparatus is good or bad in the data line driver circuit 58 of the third embodiment is described with reference to FIG. 6.

Figure 6:
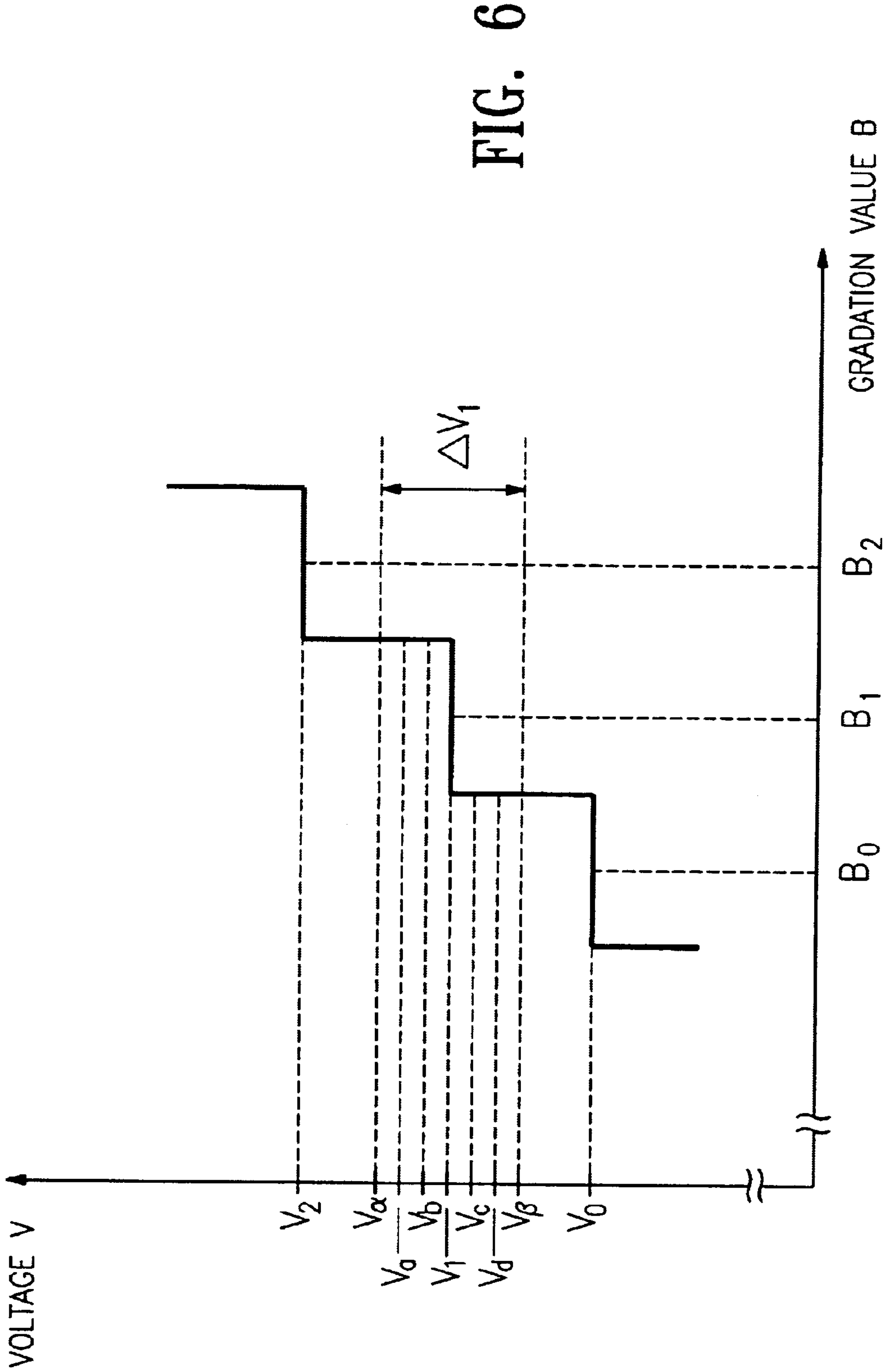
FIG. 6 illustrates the operation of the data line driver circuit shown in FIG. 4.

FIG. 6 shows an step-wise output line that represents a part of the relationship between output voltages V and gradation values B inputted in the data line driver circuit 58 when the liquid crystal apparatus shown in FIG. 4 is normally operated. The graph shows an example in which, for example, a voltage $V_1$ corresponding to a gradation value $B_1$ is output from the data line driver circuit 58. It is noted that a voltage $V_0$ that is one rank lower than the voltage $V_1$ and a voltage $V_2$ that is one rank higher than the voltage $V_1$ are shown to correspond to a gradation value $B_0$ and a gradation value $B_2$, respectively.

One instance when the voltage VI is commonly input in the data line driver circuit 58 in accordance with the present invention at the time of examination is described below. Referring to FIG. 6, a voltage $V_\beta$ indicates a boundary voltage with respect to a lower gradation value $B_0$, and a voltage $V_\alpha$ indicates a boundary voltage with respect to an upper gradation value $B_2$. A voltage range $\Delta V_1$ is a range between the voltages $V_\beta$ and $V_\alpha$, which is a voltage range that generally changes the least significant gradation value (bit) defined by an LSB (Least Significant Bit). Also, voltages $V_a$~$V_d$ are voltages that are applied to the output examination line 30 shown in FIG. 1.

Figure 7:
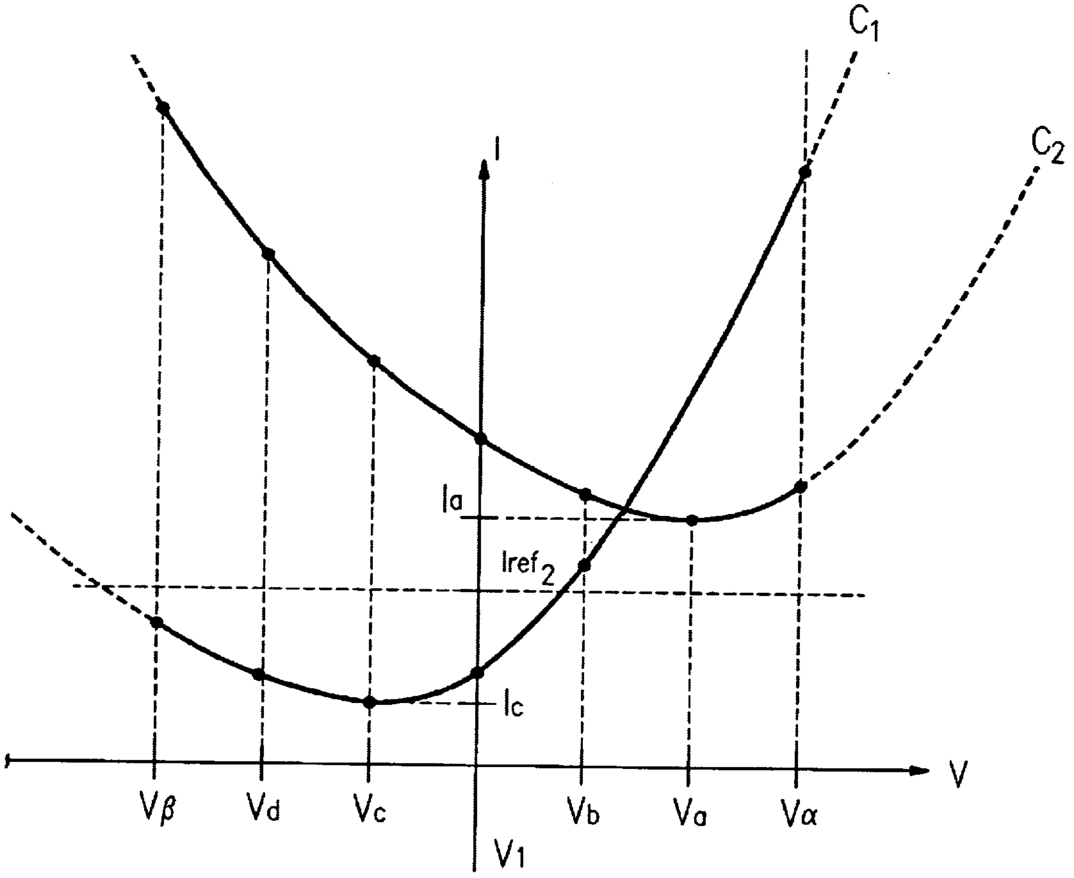
FIG. 7 is another illustration of the operation of the data line driver circuit of FIG. 4.

When the examination voltages $V_a$~$V_d$, which are within the voltage range of the voltages $V_\beta$ and $V_\alpha$, with the voltage V1 being the center, are applied to the output examination line 30 shown in FIG. 1, current values shown in FIG. 7 are detected in its closed circuit. FIG. 7 shows, for example, two cases in which relations indicated by curves $C_1$ and $C_2$ are detected in the data line driver circuits 58 in two lots, respectively. The curves $C_1$ and $C_2$ respectively represent curves that approximate current values detected on the output examination line 30 of FIG. 1.

In the curve $C_1$, when the examination voltage $V_c$, is applied, the minimum current value $I_c$ is measured. Also, in the curve $C_2$, when the examination voltage $V_a$ is applied, the minimum current value $I_a$ is measured. Before and after the respective examination voltages $V_a$ and $V_c$, potential differences between voltages detected and examination voltages applied on the output examination line 30 become greater, and therefore measured current values I become greater.

Even when the common voltage V1 is input, the current values in the curves $C_1$ and $C_2$ have minimum values at the examination voltages $V_c$, and $V_a$, respectively. This is because the performances of the respective voltage followers in the group 14 deviate from one another. If the measured current value is lower than a reference current value $I_{ref2}$, the data line driver circuit itself is determined to be a good product. In the case shown in FIG. 7, the apparatus in which the current value $I_c$ is measured is determined to be a good product because the current value $I_c$ is lower than the reference current value $I_{ref2}$. However, the apparatus in which the current value $I_a$ is measured is determined to be a bad product because the current value $I_a$ is higher than the reference current value $I_{ref2}$.

When the data line driver circuit in accordance with the third embodiment of the present invention is examined and deviations among the voltage followers with respect to a given input voltage $V_{IN}$ are within a small range, it is determined as a good product. Furthermore, in the data line driver circuit in accordance with the present embodiment, when deviations among the respective voltage followers 14-1 through 14-N are offset to one side of a vertical axis $I_{OUT}$, shown in FIG. 2 as a symmetrical axis, it is determined to be a good product. Even when such determinations are made, flickers or irregularities in a liquid crystal apparatus do not occur. Accordingly, by using a signal supply apparatus in accordance with the present invention in a liquid crystal apparatus in the manner used in the present embodiment, a more favorable examination can be performed.

Figure 8:
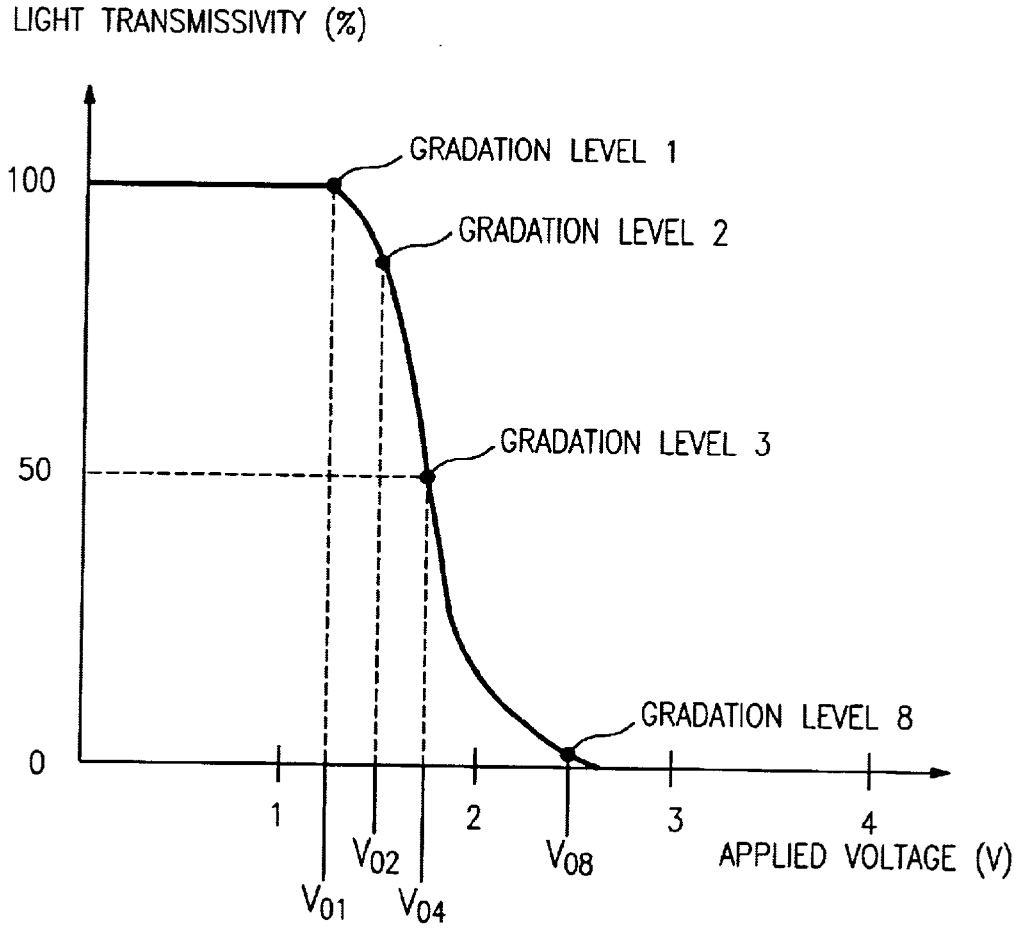
FIG. 8 illustrates a relation between voltages applied to a liquid crystal layer of the TFT type liquid crystal apparatus of FIG. 4 and light transmissivity.
Figure 9:
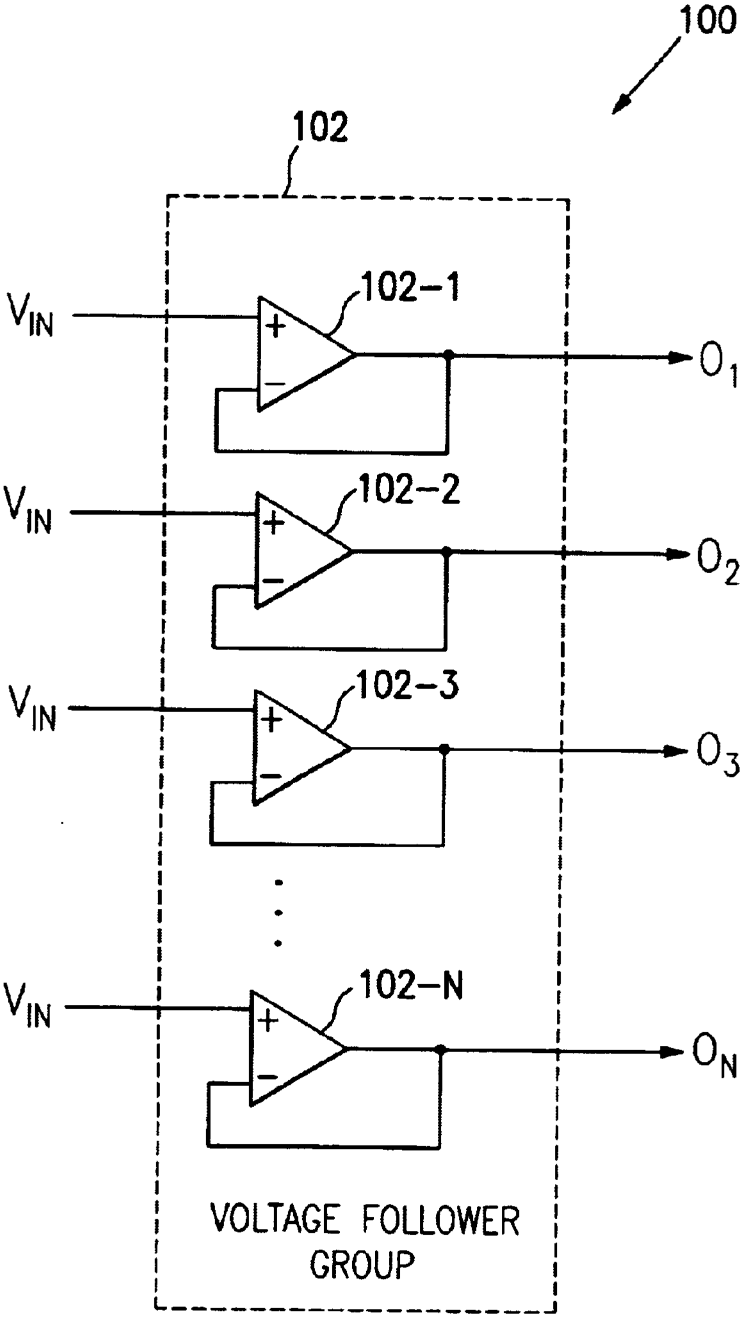
FIG. 9 PRIOR ART
FIG. 9 depicts a conventional signal supply apparatus.

Furthermore, in the present embodiment the input voltage $V_1$ may preferably be set at a voltage that represents an intermediate gradation. For example, in a liquid crystal apparatus that is capable of displaying eight different gradations, voltages V applied to the liquid crystal layer and light transmissivity have a relation shown in FIG. 8. In the normally white mode shown in FIG. 8, the inclination of the curve indicating the relation is steep in areas around the light transmissivity of 50%. Therefore, a slight deviation in the applied voltage V causes a large deviation in the light transmissivity. In this respect, a voltage $V_{04}$ representative of an intermediate gradation is used as the input voltage $V_{IN}$, such that the detection accuracy in determining whether the apparatus is good or bad can be improved.

It is noted that the third embodiment uses the signal supply apparatus 10 described above in the first embodiment in its data line driver circuit. The signal supply apparatus 40 described in the second embodiment can be used instead. In this case, the same effect provided by the second embodiment can be obtained.

Also, the present invention is not limited to the embodiments described above, and many modifications can be made within the scope of the subject matter of the present invention. For example, the present invention is not only applicable to TFT type liquid crystal apparatuses described above, but also applicable to image display apparatuses using TFD (Thin Film Diode) with two terminal elements, electroluminescence (EL), plasma display apparatuses and the like.

Also, the present invention is applicable to a variety of electronic devices equipped with electro-optical apparatus, for example, cellular telephones, gaming devices, electronic notebooks, personal computers, word processors, televisions, and car-navigation devices.

What is claimed is:

1. A method for examining a signal supply apparatus in which signals having specified voltages supplied from a plurality of signal supply sources are subject to impedance conversion, respectively, by a plurality of impedance conversion devices, and supplied to a plurality of output lines, respectively, the method comprising:

short-circuiting each of the plurality of output lines upon examination; and comparing a current value detected on the short-circuited lines and a specified current value to thereby determine whether the signal supply apparatus is good or bad, wherein the signal supply apparatus comprises:

a plurality of switching elements provided for the corresponding respective plurality of output lines;

a test terminal for inputting a test signal that controls operation of each of the plurality of switching elements; and a detection terminal that is connected to the short-circuited lines.

2. A method for examining a signal supply apparatus in which signals are subject to impedance conversion by a plurality of impedance conversion devices, respectively, and supplied to a plurality of output lines, the method comprising:

short-circuiting each of the plurality of output lines upon examination; and comparing a composite current consumption value for the plurality of impedance conversion devices and a specified current value to determine whether the signal supply apparatus is good or bad, wherein the signal supply apparatus comprises:

a plurality of switching elements provided for the corresponding respective plurality of output lines;

a test terminal for inputting a test signal that controls operation of each of the plurality of switching elements;

a short-circuit line that short-circuits the plurality of output lines when the plurality of switching elements are operated; and a detection terminal for detecting the composite current consumption value.

3. A semiconductor device including a signal supply apparatus in which signals having specified voltages supplied from a plurality of signal supply sources are subject to impedance conversion, respectively, by a plurality of impedance conversion devices, and supplied to a plurality of output lines, respectively, wherein the signal supply apparatus comprises:

a plurality of switching elements provided for the corresponding respective plurality of output lines;

a test terminal for inputting a test signal that controls operation of each of the plurality of switching elements;

a detection terminal that is connected to the short-circuited lines, means for short-circuiting each of the plurality of output lines upon examination; and means for comparing a current value detected on the short-circuited lines and a specified current value to thereby determine whether the signal supply apparatus is good or bad.

4. A data line driver IC including a signal supply apparatus in which signals having specified voltages supplied from a plurality of signal supply sources are subject to impedance conversion, respectively, by a plurality of impedance conversion devices, and supplied to a plurality of output lines, respectively, wherein the signal supply apparatus comprises:

a plurality of switching elements provided for the corresponding respective plurality of output lines;

a test terminal for inputting a test signal that controls operation of each of the plurality of switching elements;

a detection terminal that is connected to the short-circuited lines, means for short-circuiting each of the plurality of output lines upon examination; and means for comparing a current value detected on the short-circuited lines and a specified current value to thereby determine whether the signal supply apparatus is good or bad, wherein the signal supply apparatus is used as a driver device to drive each of a plurality of data lines in a display section using electro-optical elements.

5. A data line driver IC according to claim 4, wherein, after a voltage is supplied to the test terminal and each of the plurality of switching elements is operated, a voltage with a voltage width range corresponding to ±(LSB)/2 with respect to a signal having the specified voltage to be supplied to the electro-optical elements is supplied through the detection terminal to the short-circuit line, and a minimum value among the current values detected at the detection terminal in response thereto is compared with a specified current value to make a good-or-bad determination.

6. A data line driver IC according to claim 5, wherein the specified voltage is set as a voltage that is supplied to the electro-optical element when the display section displays an intermediate gradation.

7. An electro-optical apparatus comprising a data line driver IC including a signal supply apparatus in which signals having specified voltages supplied from a plurality of signal supply sources are subject to impedance conversion, respectively, by a plurality of impedance conversion devices, and supplied to a plurality of output lines, respectively, wherein the signal supply apparatus comprises:

a plurality of switching elements provided for the corresponding respective plurality of output lines;

a test terminal for inputting a test signal that controls operation of each of the plurality of switching elements;

a detection terminal that is connected to the short-circuited lines;

means for short-circuiting each of the plurality of output lines upon examination; and means for comparing a current value detected on the short-circuited lines and a specified current value to thereby determine whether the signal supply apparatus is good or bad, wherein the signal supply apparatus is used as a driver device to drive each of a plurality of data lines in a display section using electro-optical elements.

8. An electronic apparatus comprising an electro-optical apparatus comprising a data line driver IC including a signal supply apparatus in which signals having specified voltages supplied from a plurality of signal supply sources are subject to impedance conversion, respectively, by a plurality of impedance conversion devices, and supplied to a plurality of output lines, respectively, wherein the signal supply apparatus comprises:

a plurality of switching elements provided for the corresponding respective plurality of output lines;

a test terminal for inputting a test signal that controls operation of each of the plurality of switching elements;

a detection terminal that is connected to the short-circuited lines, means for short-circuiting each of the plurality of output lines upon examination; and means for comparing a current value detected on the short-circuited lines and a specified current value to thereby determine whether the signal supply apparatus is good or bad, wherein the signal supply apparatus is used as a driver device to drive each of a plurality of data lines in a display section using electro-optical elements.

9. A signal supply apparatus in which signals having specified voltages supplied from a plurality of signal supply sources are subject to impedance conversion, respectively, by a plurality of impedance conversion devices, and supplied to a plurality of output lines, respectively, wherein the signal supply apparatus is adapted to be examined to determine whether the signal supply apparatus is good or bad, wherein the signal supply apparatus comprises:

a plurality of switching elements provided for the corresponding respective plurality of output lines;

a test terminal for inputting a test signal that controls operation of each of the plurality of switching elements;

a detection terminal that is connected to the short-circuited lines;

means for short-circuiting each of the plurality of output lines upon examination; and means for comparing a current value detected on the short-circuited lines and a specified current value to thereby determine whether the signal supply apparatus is good or bad.

10. A signal supply apparatus in which signals are subject to impedance conversion by a plurality of impedance conversion devices, respectively, and supplied to a plurality of output lines, wherein the signal supply apparatus is adapted to be examined to determine whether the signal supply apparatus is good or bad, wherein the signal supply apparatus comprises:

a plurality of switching elements provided for the corresponding respective plurality of output lines;

a test terminal for inputting a test signal that controls operation of each of the plurality of switching elements;

a short-circuit line that short-circuits the plurality of output lines when the plurality of switching elements are operated;

a detection terminal for detecting the composite current consumption value;

means for short-circuiting each of the plurality of output lines upon examination; and means for comparing a composite current consumption value for the plurality of impedance conversion devices and a specified current value to determine whether the signal supply apparatus is good or bad.

* * * * *